(12) United States Patent
Mita et al.

(10) Patent No.: US 11,769,649 B2
(45) Date of Patent: Sep. 26, 2023

(54) MULTIPOLE UNIT AND CHARGED PARTICLE BEAM DEVICE

(71) Applicant: Hitachi High-Tech Corporation, Tokyo (JP)

(72) Inventors: Masanori Mita, Tokyo (JP); Yoshinobu Ootaka, Tokyo (JP); Hideto Dohi, Tokyo (JP); Zhaohui Cheng, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 134 days.

(21) Appl. No.: 17/576,156

(22) Filed: Jan. 14, 2022

(65) Prior Publication Data

US 2022/0270844 A1     Aug. 25, 2022

(30) Foreign Application Priority Data

Feb. 19, 2021    (JP) .................................. 2021-025344

(51) Int. Cl.
| | | |
|---|---|---|
| *H01J 37/153* | (2006.01) | |
| *H01J 37/141* | (2006.01) | |
| *H01J 37/147* | (2006.01) | |

(52) U.S. Cl.
CPC ........ *H01J 37/153* (2013.01); *H01J 37/1413* (2013.01); *H01J 37/1474* (2013.01); *H01J 2237/141* (2013.01); *H01J 2237/1415* (2013.01); *H01J 2237/1534* (2013.01)

(58) Field of Classification Search
CPC .. H01J 37/153; H01J 37/1413; H01J 37/1474; H01J 2237/141; H01J 2237/1415; H01J 2237/1534
See application file for complete search history.

(56) References Cited

U.S. PATENT DOCUMENTS

| | | |
|---|---|---|
| 7,012,261 B2 | 3/2006 | Kawai et al. |
| 9,343,260 B2 | 5/2016 | Urano et al. |
| 9,349,565 B2 | 5/2016 | Sawada |

FOREIGN PATENT DOCUMENTS

| | | |
|---|---|---|
| JP | 2005-19071 A | 1/2005 |
| JP | 2012-209130 A | 10/2012 |
| JP | 2015-207351 A | 11/2015 |

*Primary Examiner* — Nicole M Ippolito
*Assistant Examiner* — Hanway Chang
(74) *Attorney, Agent, or Firm* — Crowell & Moring LLP

(57) ABSTRACT

An object is to provide a multipole unit capable of achieving both high positional accuracy and ease of assembling and preventing a decrease in the transmission rate of the magnetic flux. A multipole unit 109a includes a pole 1 that is made of a soft magnetic metal material, a shaft 2 that is made of a soft magnetic metal material and is magnetically connected to the pole, and a coil 3 that is wound around the shaft 2. The pole 1 is provided with a first fitting portion JP1 that forms a first recessed portion or a first protruding portion. The shaft 2 is provided with a second fitting portion JP2 that forms a second protruding portion or a second recessed portion. The first fitting portion JP1 and the second fitting portion JP2 are fitted with each other such that the pole 1 and the shaft 2 are physically separated from each other.

11 Claims, 10 Drawing Sheets

MULTIPOLE UNIT AND CHARGED PARTICLE BEAM DEVICE

TECHNICAL FIELD

This application relates to a multipole unit and a charged particle beam device, and more particularly, relates to a multipole unit including a pole magnetically connected to a shaft, and a charged particle beam device including the multipole unit.

BACKGROUND ART

In a charged particle beam device such as a microscope and a semiconductor manufacturing device applying a charged particle beam, a multipole unit including a plurality of poles is used for a deflector or an aberration corrector of the charged particle beam. In recent years, processing on an order of 10 nanometers and observation on an order of 0.1 nanometer are performed with these charged particle beam devices. In order to implement the processing and the observation of such scales, it is necessary to assemble the multipole unit with high positional accuracy in the deflector or the aberration corrector in the charged particle beam device.

For example, PTL 1 discloses a technique in which, in fixing portions between a plurality of poles and an annular yoke (outer magnetic path), support rods of poles support rods of poles are fixed to elongated hole-shaped openings provided in the yoke. In this fixing method, since line contact is established at two points, it is possible to reduce application of a stress to the pole and to reduce positional deviation of the pole.

PTL 2 and PTL 3 disclose a structure in which a tip end portion of a pole and a magnetic shaft around which a coil is wound are formed as separate members.

PTL 2 discloses a technique of forming multistage poles by arranging a plurality of poles side by side in an optic axis direction and brazing the plurality of poles to an insulating support column that holds the poles. With respect to a non-magnetic housing provided with a plurality of guide grooves parallel to the optic axis direction, the multistage poles are fitted into the guide grooves and fixed, shafts are fixed to the poles, and a yoke is assembled to the shafts, thereby forming a multistage multipole unit.

PTL 3 discloses a structure in which the tip end portion of the pole and the shaft around which the coil is wound are physically separated from each other. A magnetic flux from the shaft leaks into a gap of a separation portion and is transmitted to the tip end portion of the pole. As a result, the pole and the shaft are magnetically connected. By providing a vacuum partition wall at the separation portion, the tip end portion of the pole can be arranged in a vacuum, and the coil can be arranged in the atmosphere.

CITATION LIST

Patent Literature

PTL 1: JP-A-2005-019071
PTL 2: JP-A-2012-209130
PTL 3: JP-A-2015-207351

SUMMARY OF INVENTION

Technical Problem

In PTL 1, a coil is wound around the pole, and the pole is made of an integral member from a tip end portion of the pole to a base end portion fixed to the annular yoke. In the integrated pole, since a length of the pole is long, when a fixing angle slightly deviates at a fixing portion of the base end portion, a large positional deviation occurs at the tip end portion of the pole. In order to prevent the positional deviation, it is necessary to repeat position adjustment, angle adjustment, and assembling until the plurality of poles assembled at the same time with high positional accuracy and high angle accuracy. Therefore, an enormous amount of time is required for manufacturing the multipole unit. In PTL 1, since the plurality of poles are fixed to the same yoke and electric insulation between the poles is not possible, an electrostatic multipole unit cannot be manufactured.

In PTL 2, the non-magnetic housing and the poles can be processed with high accuracy. Since the poles are positioned along the guide grooves of the housing and are fitted into the guide grooves, the poles can be fixed to the housing with high positional accuracy. However, since a gap is defined between the housing and each of the poles, a stress is applied to the pole at the time of attaching the magnetic shaft to the pole. Therefore, the pole may be deformed and a position of the pole may deviate. In a multipole unit in which the pole is deformed and the position of the pole deviates, an unexpected parasitic field is generated when a multipole field is output, and a parasitic aberration is generated. Thus, when the multipole unit is applied to the charged particle beam device, a problem arises that resolution of an observation image deteriorates.

In PTL 3, the pole and the magnetic shaft are not in physical contact with each other, and are simply separated from each other to face each other at end faces thereof. Therefore, no stress is generated at a time of fastening the pole and the shaft, and thus it is impossible that the pole is deformed and the position of the pole deviates. However, in consideration of the transmission of the magnetic flux, most of the magnetic flux generated by the coil escapes into the air because the pole and the shaft are simply separated. Therefore, a problem arises that a transmission rate of the magnetic flux to the pole greatly decreases.

PTL 3 also discloses an example in which the vacuum partition wall is arranged in the separation portion in order to arrange the pole in the vacuum. However, since it is necessary to increase a width of the separation portion to be equal to or greater than a thickness of the vacuum partition wall, when the vacuum partition wall is arranged, the transmission rate of the magnetic flux further decreases.

A main object of the present application is to provide a multipole unit capable of achieving both high positional accuracy and ease of assembling and preventing a decrease in the transmission rate of the magnetic flux. By applying the multipole unit, performance of the charged particle beam device is improved, such as preventing deterioration of the resolution of the observation image. Other technical problems and new features will be apparent from the description and drawings.

Solution to Problem

A multipole unit according to an embodiment includes a pole made of a soft magnetic metal material, a shaft made of a soft magnetic metal material and magnetically connected to the pole, and a coil wound around the shaft. The pole is provided with a first fitting portion that forms a first recessed portion or a first protruding portion. The shaft is provided with a second fitting portion that forms a second protruding portion or a second recessed portion. The second fitting portion forms the second protruding portion when the first fitting portion is the first recessed portion, and forms the second recessed portion when the first fitting portion is the first protruding portion. The first fitting portion and the second fitting portion are fitted with each other such that the pole and the shaft are physically separated from each other.

Advantageous Effect

According to the embodiment, it is possible to provide a multipole unit capable of achieving both high positional accuracy and ease of assembling and preventing the decrease in the transmission rate of the magnetic flux. By applying the multipole unit, the performance of the charged particle beam device can be improved.

DESCRIPTION OF EMBODIMENTS

Hereinafter, embodiments will be described in detail with reference to the drawings. In all the drawings for illustrating the embodiments, members having the same functions are denoted by the same reference signs, and repeated descriptions thereof will be omitted. In the following embodiments, description of the same or similar portion will not be repeated in principle unless necessary.

In addition, in the drawings for illustrating the embodiments, hatching may be omitted to make each configuration easy to understand.

An X direction, a Y direction, and a Z direction described in the present application intersect one another and are orthogonal to one another. In the present application, the Z direction is described as a vertical direction, a height direction, or a thickness direction of a structure.

First Embodiment

A multipole unit 109a according to a first embodiment will be described below with reference to FIGS. 1 and 2.

Figure 10:
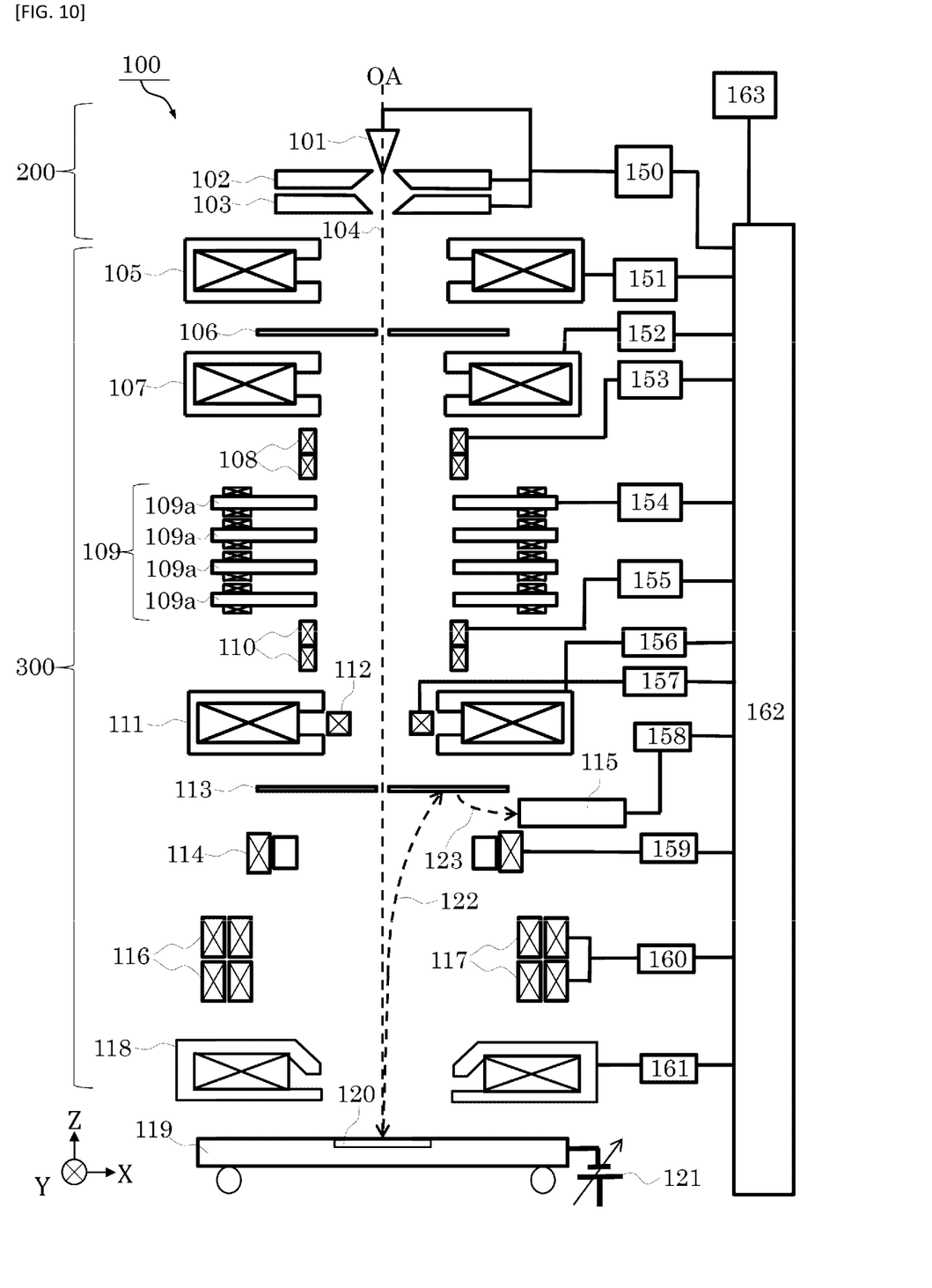
FIG. 10 is a schematic view of a charged particle beam device according to a sixth embodiment.

The multipole unit 109a mainly includes a plurality of poles 1, a plurality of shafts 2, a plurality of coils 3, a housing 4, and an outer magnetic path (magnetic yoke) 6. The multipole unit 109a is applied as a multipole lens in a charged particle beam device 100, which is shown in FIG. 10 and will be described later, and is applied as a 12-pole 4-stage aberration corrector 109.

A method of applying the multipole unit 109a is not limited only to the aberration corrector 109. For example, the multipole unit 109a can be applied to a deflector, a stigmator, or a Wien filter.

Figure 1:
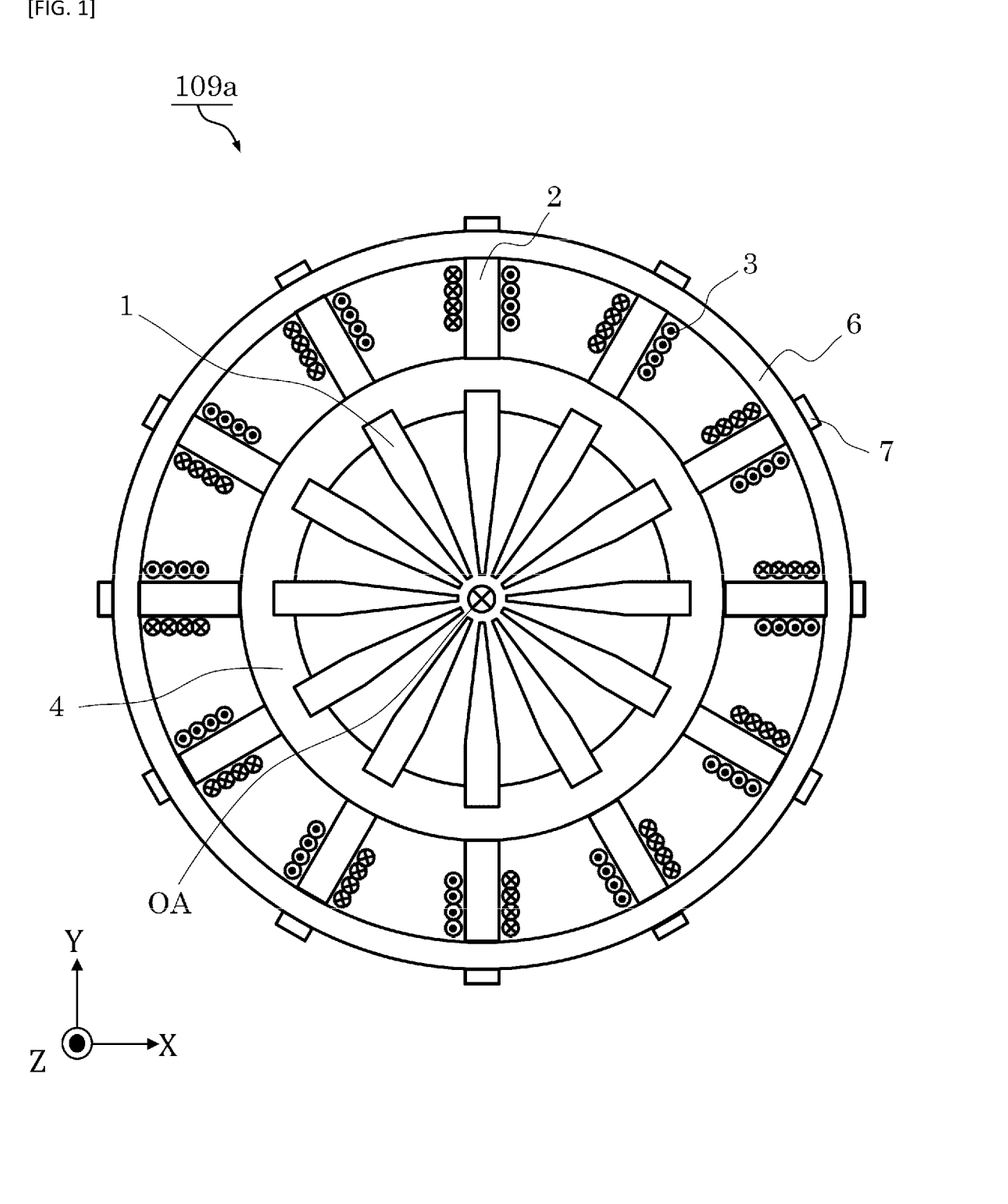
FIG. 1 is a plan view of a multipole unit according to a first embodiment.

As shown in FIG. 1, the plurality of poles 1 and the plurality of shafts 2 are arranged concentrically with respect to an optic axis OA of the charged particle beam device 100 in a plan view, and are fixed to the housing 4 that is in a tubular shape. The plurality of shafts 2 are magnetically connected to the outer magnetic path 6 that is in an annular shape in a plan view. The plurality of coils (exciting coils) 3 are wound around the plurality of shafts 2 respectively.

Figure 2:
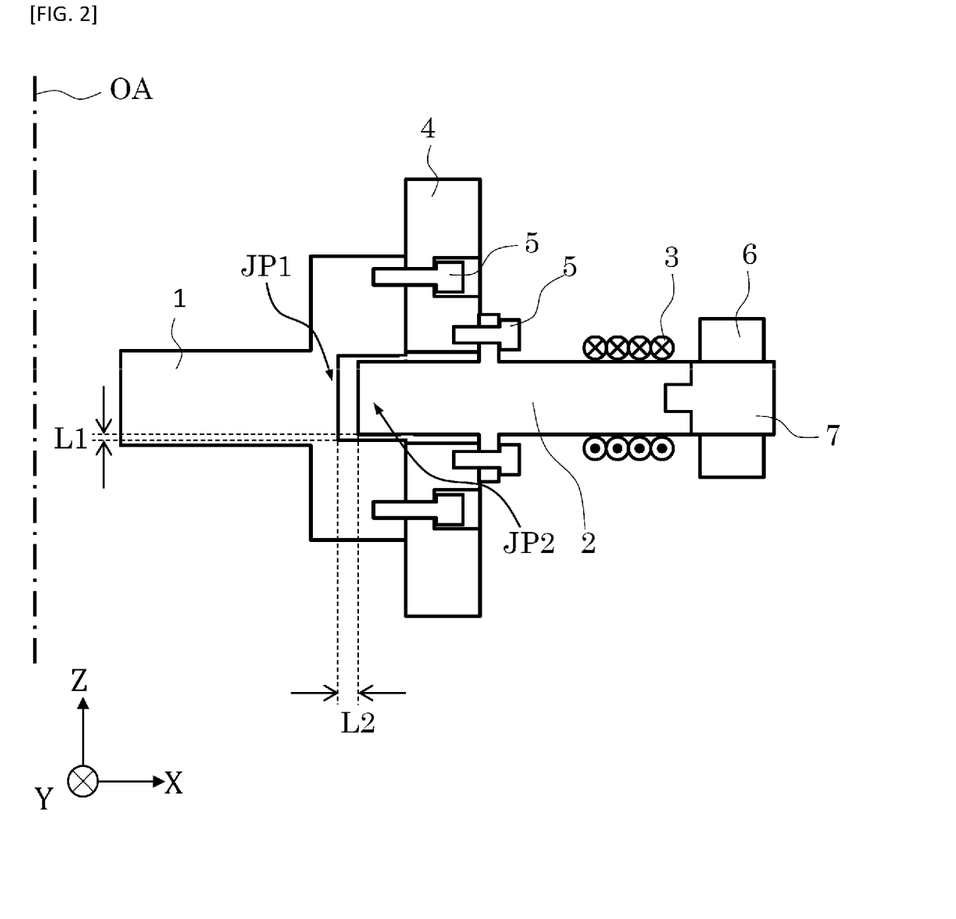
FIG. 2 is a cross-sectional view of the multipole unit according to the first embodiment.

As shown in FIG. 2, the pole 1 is fixed to an inner wall of the housing 4 by screws 5, and the shaft 2 is fixed to an outer wall of the housing 4 by the screws 5. A groove serving as a guide for positioning the pole 1 is opened in the housing 4. By fitting the pole 1 along the groove, the pole 1 is fixed to the housing 4 with high positional accuracy.

A hole for fixing the shaft 2 is opened in the outer magnetic path 6. The shaft 2 and the outer magnetic path 6 are coupled by fitting a coma 7 that is a part of a member constituting the shaft 2 into the hole.

The pole 1, the shaft 2, the outer magnetic path 6, and the coma 7 are made of, for example, a soft magnetic metal material such as pure iron, permalloy, or permendur. Accordingly, the pole 1, the shaft 2, the outer magnetic path 6, and the coma 7 are magnetically connected, and a magnetic flux can be transmitted between the pole 1, the shaft 2, the outer magnetic path 6, and the coma 7.

The housing 4 is made of a non-magnetic metal material. Accordingly, a magnetic field supplied from an outside of the housing 4 can be separated and transmitted to each of the plurality of poles 1 located inside the housing 4.

The pole 1 is provided with a first fitting portion JP1 that forms a first recessed portion or a first protruding portion. The shaft 2 is provided with a second fitting portion JP2 that forms a second protruding portion or a second recessed portion. The second fitting portion JP2 forms the second protruding portion when the first fitting portion JP1 is the first recessed portion, and forms the second recessed portion when the first fitting portion JP1 is the first protruding portion. In the following description, a case where the first fitting portion JP1 forms the first recessed portion and the second fitting portion JP2 forms the second protruding portion will be described. However, a technical idea of the present application can be applied also in a case where the first fitting portion JP1 forms the first protruding portion and the second fitting portion JP2 forms the second recessed portion.

The second fitting portion JP2 provided at an end portion of the shaft 2 is inserted into the first fitting portion JP1 provided at an end portion of the pole 1. Here, a gap is defined between the pole 1 and the shaft 2 (between the first fitting portion JP1 and the second fitting portion JP2) so that the first fitting portion JP1 and the second fitting portion JP2 are not in direct contact with each other. That is, the first fitting portion JP1 and the second fitting portion JP2 are fitted with each other such that the pole 1 and the shaft 2 are physically separated from each other.

Hereinafter, a relation that a gap is defined between a first structure and a second structure inserted into the first structure, and the two structures are not in direct physical contact with each other is described as "loose insertion" as the first fitting portion JP1 and the second fitting portion JP2 are in.

Further, positional deviation at a tip end portion (the side of the pole 1) of the shaft 2 increases as deviation in a fixing angle at a fixing position of the shaft 2 increases. Therefore, in consideration of an allowable range of the positional deviation, it is necessary to design width of the gap between the first structure and the second structure. When the width of the gap can be reduced, a transmission rate of the magnetic flux can be further improved. In the following description, reducing the width of the gap may be described as absorbing an assembling tolerance.

A distance L1 and a distance L2 shown in FIG. 2 are the width of the gap, and are distances between the pole 1 and the shaft 2. The distance L1 is a distance in a direction perpendicular to a direction (X direction) in which the second fitting portion JP2 is fitted into the first fitting portion JP1, and is a distance in a cross-sectional view perpendicular to the X direction. The distance L2 is a distance in a direction parallel to the direction (X direction) in which the second fitting portion JP2 is fitted into the first fitting portion JP1.

The distance L1 and the distance L2 may not be of the same value. In the first embodiment, the distance L1 is several hundreds of micrometers, and the distance L2 is several millimeters. Distances L3, L5, L7, and L9 described in other embodiments have the same definition as the distance L1 in the first embodiment, and the distances L4, L6, L8, and L10 have the same definition as the distance L2 in the first embodiment.

As described above, in the first embodiment, since each of the pole 1 and the shaft 2 is independently fixed to the housing 4 by the screws 5, the pole 1 and the shaft 2 can be fixed to the housing 4 with high positional accuracy.

Furthermore, since the pole 1 and the shaft 2 are made a loose insertion structure, in assembling the multipole unit 109a, the multipole unit 109a can be assembled without applying a stress from the shaft 2 to the pole 1. Therefore, the positional deviation of the pole 1 can be prevented, and thus generation of an unexpected parasitic field at a time of outputting a multipole field and generation of a parasitic aberration can be prevented.

Therefore, position adjustment of the poles 1 is unnecessary at the time of assembling the multipole unit 109a, and thus the multipole unit 109a can be assembled while improving uniformity of dimensions of the poles 1, the positions of the poles 1, and orientation in a circumferential direction, regardless of the skills of an assembling operator.

That is, according to the first embodiment, it is possible to provide the multipole unit 109a that achieves both the high positional accuracy and ease of assembling. When the multipole unit 109a is applied to the charged particle beam device, since the generation of the parasitic aberration can be prevented, deterioration of resolution of an observation image can be prevented, and performance of the charged particle beam device can be improved.

Figure 3:
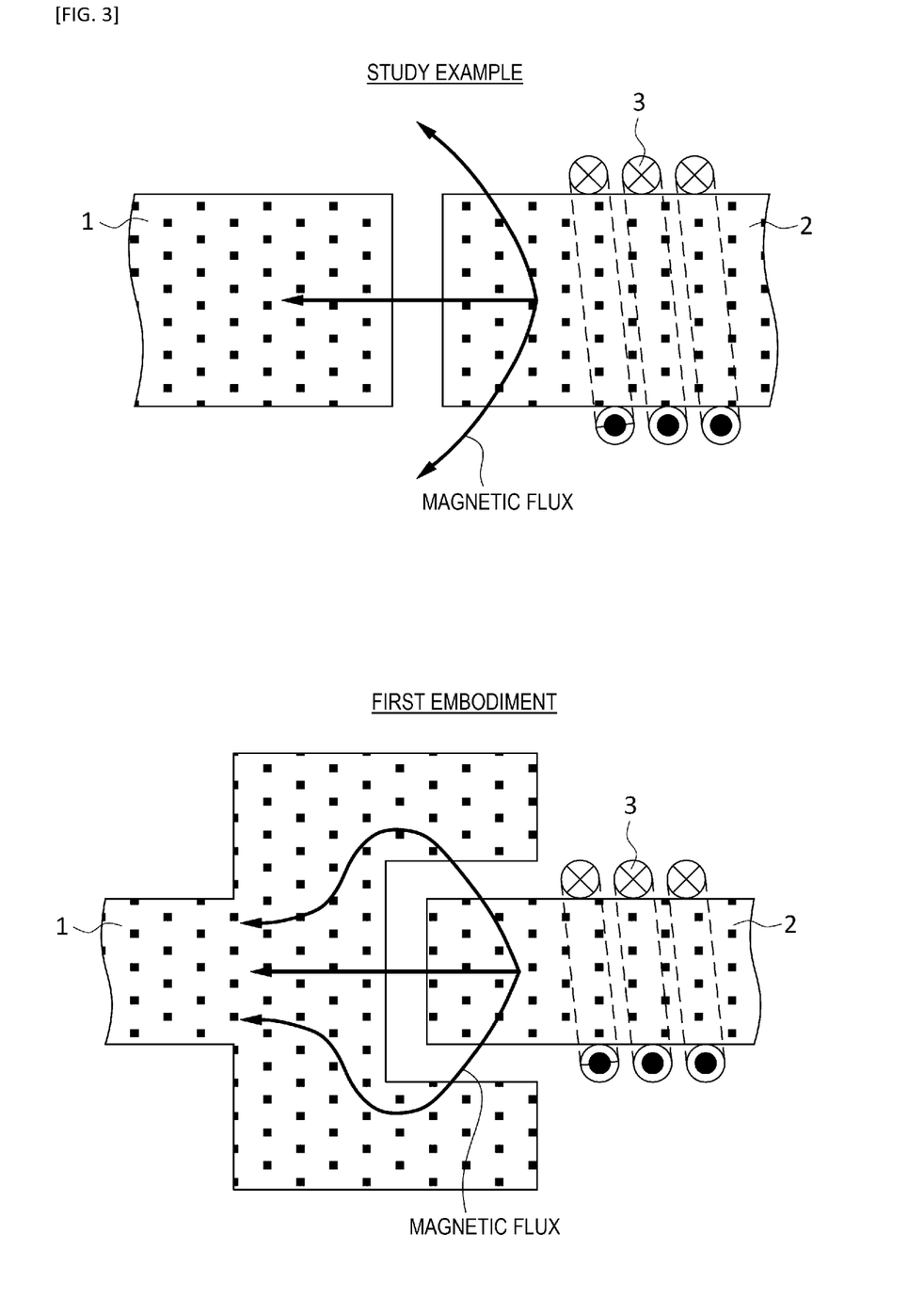
FIG. 3 is a cross-sectional view of a main part for explaining an effect of the multipole unit according to the first embodiment.

A relation between the gap, which is located between the pole 1 and the shaft 2, and the transmission rate of magnetic flux will be described below with reference to FIG. 3. FIG. 3 shows a structure according to a study example made by the inventors of the present application based on PTL 3 and a structure according to the first embodiment.

In the structure of the study example, the pole 1 and the shaft 2 are physically separated from each other, and flat surfaces of the pole 1 and the shaft 2 face each other. Therefore, a large part of a magnetic flux generated by the coil 3 escapes into air. That is, a problem arises that the transmission rate of the magnetic flux to the pole greatly decreases because the pole 1 and the shaft 2 are simply separated.

In contrast, in the first embodiment, the first fitting portion JP1 and the second fitting portion JP2 are fitted with each other while being physically separated from each other. Therefore, a large part of the magnetic flux generated by the coil 3 escapes from the second fitting portion JP2 of the shaft 2 to the gap, passes through the gap, and is transmitted to the first fitting portion JP1 of the pole 1. That is, the magnetic flux leaking from the second fitting portion JP2 can be received by the first fitting portion JP1, and thus a decrease in the transmission rate of the magnetic flux can be prevented.

As described above, according to the first embodiment, it is possible to provide the multipole unit 109a capable of achieving both the high positional accuracy and the ease of assembling and preventing the decrease in the transmission rate of the magnetic flux.

Hereinafter, a method of assembling the multipole unit 109a according to the first embodiment will be described.

First, the pole 1 and the housing 4 are fixed by the screws 5. Next, the second fitting portion JP2 of the shaft 2 is loosely inserted into the first fitting portion JP1 of the pole 1. Subsequently, the shaft 2 is fixed to the housing 4 by the screws 5, and is fixed to the outer magnetic path 6 by the coma 7.

Items described below are not limited to the first embodiment, and the same applies to second to fifth embodiments to be described later.

For example, in the first embodiment, a combination of a recessed shape and a protruding shape of the first fitting portion JP1 and the second fitting portion JP2 is not particularly limited as long as the loose insertion is possible. For example, a combination of any shapes can be applied, such as a combination of a tubular recessed portion and a cylindrical protruding portion, a combination of a recessed portion with a square hole and a prismatic protruding portion, or a combination of a tubular recessed portion and a prismatic protruding portion.

Further, in the description of the first embodiment, the multipole unit 109a includes twelve poles 1 arranged at equal intervals in the circumferential direction. The multipole unit 109a is arranged in four stages in a direction along the optic axis OA, and is applied as the 12-pole 4-stage aberration corrector 109. However, the number of poles 1 may be any number such as four, six, or eight, and the arrangement interval of the poles 1 in the circumferential direction may be arbitrary. The number of stages can be set to any number, such as one or two.

Second Embodiment

Figure 4:
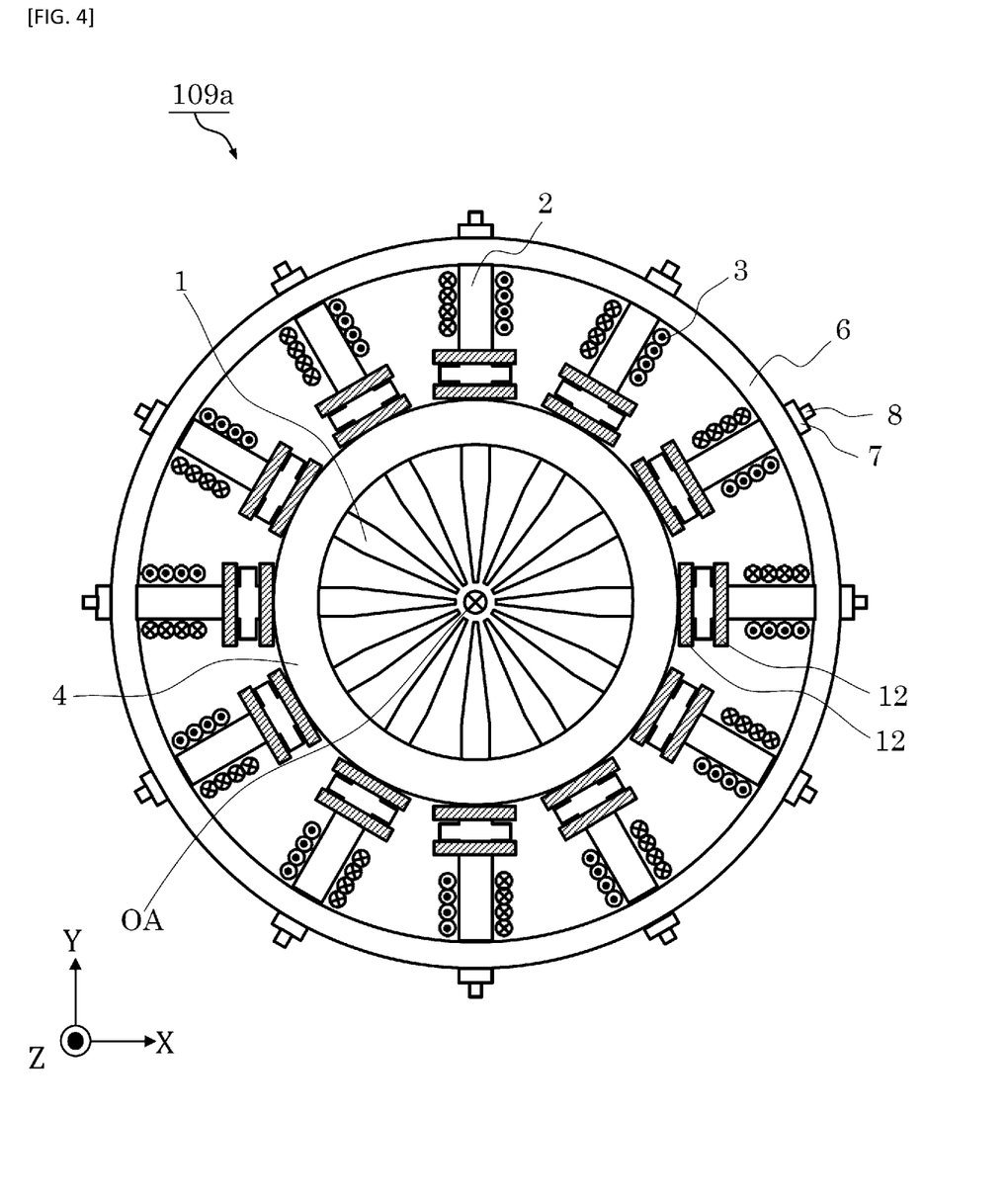
FIG. 4 is a plan view of a multipole unit according to a second embodiment.
Figure 5:
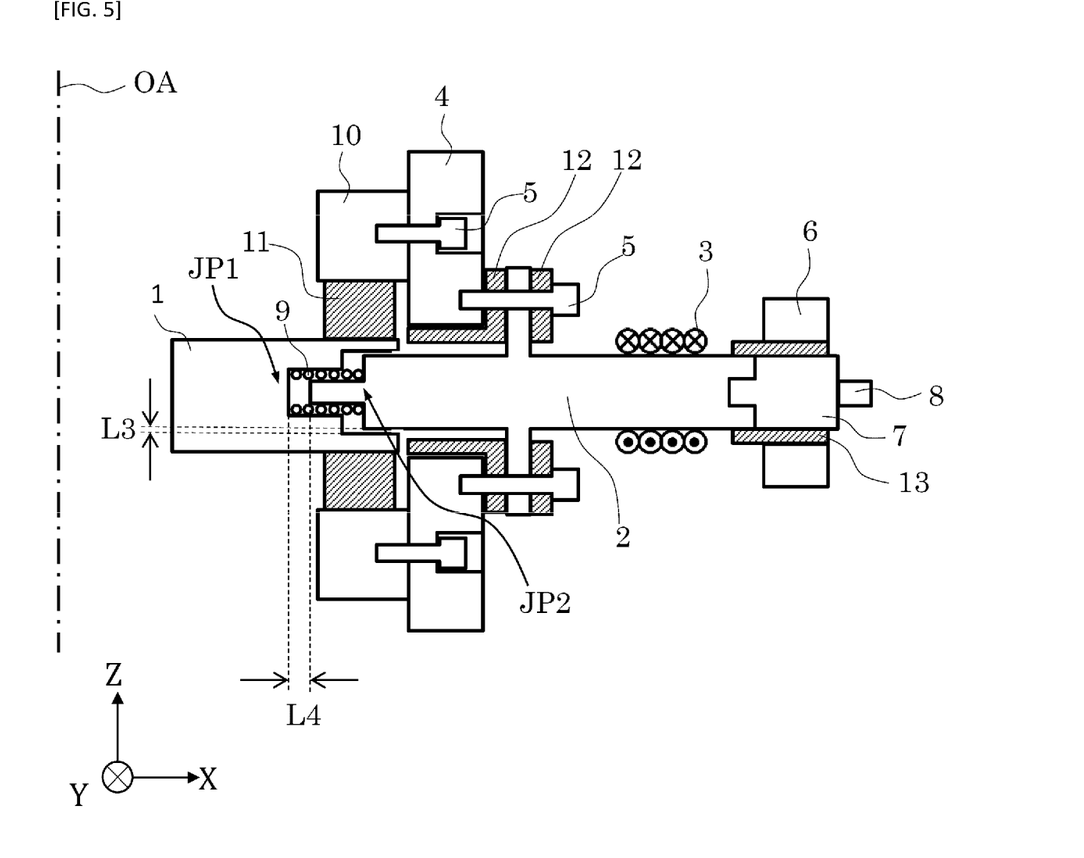
FIG. 5 is a cross-sectional view of the multipole unit according to the second embodiment.

The multipole unit 109a according to a second embodiment will be described below with reference to FIGS. 4 and 5. In the following description, differences from the first embodiment will be mainly described, and description of points that overlap with the first embodiment will be omitted.

The pole 1 in the second embodiment constitutes an electromagnetic field composite type pole. In view of this, as shown in FIGS. 4 and 5, the shaft 2 is provided with a voltage supply terminal 8 for supplying a predetermined voltage to the shaft 2. Here, the voltage supply terminal 8 is provided on the coma 7 that is a part of the member constituting the shaft 2.

An elastic member 9 having conductivity is provided in the gap between the first fitting portion JP1 and the second fitting portion JP2 so that the pole 1 and the shaft 2 are electrically connected. The elastic member 9 is, for example, a metal spring, a conductive gel, a conductive polymer, or the like. However, the elastic member 9 may be another structure and another material as long as it is a member having conductivity and elasticity.

In the second embodiment, since the elastic member 9 is provided, the distance L4 needs to be several millimeters, and the distance L3 is less than the distance L4 and is several hundreds of micrometers. As a result, the decrease in the transmission rate of the magnetic flux can be prevented.

It is necessary to electrically insulate the pole 1 and the housing 4 from each other when a voltage is to be applied to the pole 1. Therefore, fixing metal fittings 10 and insulating members 11 each formed of an insulator or the like are arranged on the upper and lower sides of the pole 1. The fixing metal fittings 10 and the housing 4 are fixed by the screws 5. That is, the pole 1 is fixed to the housing 4 via the insulating members 11 and the fixing metal fittings 10 so as to be electrically insulated from the housing 4. The pole 1, the insulating members 11, and the fixing metal fittings 10 are assembled by brazing or the like.

Similarly to the pole 1, the shaft 2 and the housing 4 also need to be electrically insulated from each other. Therefore, insulating members 12 are sandwiched between the shaft 2 and the housing 4 and between the shaft 2 and the screw 5. That is, the shaft 2 is fixed to the housing 4 via the insulating members 12 such that the shaft 2 is electrically insulated from the housing 4.

Furthermore, it is necessary to electrically insulate the shaft 2 and the coma 7 from the outer magnetic path 6. Therefore, an insulating sleeve 13 is arranged between the outer magnetic path 6 and the shaft 2 and between the outer magnetic path 6 and the coma 7. That is, the shaft 2 is fixed to the outer magnetic path via the insulating sleeve 13 such that the shaft is electrically insulated from the outer magnetic path 6. The insulating members 12 and the insulating sleeve 13 are made of an insulating resin, for example, polyphenylene sulfide (PPS).

As described above, portions to which a voltage is applied (the pole 1, the elastic member 9, the shaft 2, the coma 7, and the voltage supply terminal 8) are electrically insulated from the outer magnetic path 6, the housing 4, and the other poles 1. Since the plurality of poles 1 are insulated from one another, different voltages can be independently applied to the plurality of poles 1 from the voltage supply terminal 8 electrically connected to each of the plurality of poles 1. In this way, the electromagnetic field composite type pole capable of simultaneously outputting an electric field and a magnetic field is formed.

When the elastic member 9 is made of a material capable of transmitting the magnetic flux, for example, a soft magnetic metal material, the elastic member 9 is capable of transmitting the magnetic flux from the shaft 2 to the pole 1. In this case, the decrease in the transmission rate of the magnetic flux can be further prevented, and uniformity of the magnetic field is further improved.

A method of assembling the multipole unit 109a according to the second embodiment will be described below.

First, the pole 1, the insulating members 11, and the fixing metal fittings 10 are assembled by brazing, for example. Next, the fixing metal fittings 10 and the housing 4 are fixed by the screws 5. Subsequently, the elastic member 9 is provided in the first fitting portion JP1 of the pole 1. Next, the second fitting portion JP2 is brought into contact with the elastic member 9 while the second fitting portion JP2 of the shaft 2 is loosely inserted into the first fitting portion JP1. Finally, the shaft 2 is fixed to the housing 4 via the insulating members 12 by the screws 5. The shaft 2 is fixed to the outer magnetic path 6 via the insulating sleeve 13 by the coma 7.

Here, in the second embodiment, since the elastic member 9 is arranged between the pole 1 and the shaft 2, a stress is applied to the pole 1 via the elastic member 9 when the shaft 2 is loosely inserted. However, this stress is as small as an elastic force of the elastic member 9 formed of the spring or the like. Therefore, the positional deviation and deformation of the pole 1 due to this stress hardly occur, and thus the generation of the unexpected parasitic field can be prevented.

Third Embodiment

The multipole unit 109a according to a third embodiment will be described below with reference to FIG. 6. In the following description, differences from the second embodiment will be mainly described, and description of points that overlap with the second embodiment will be omitted.

Figure 6:
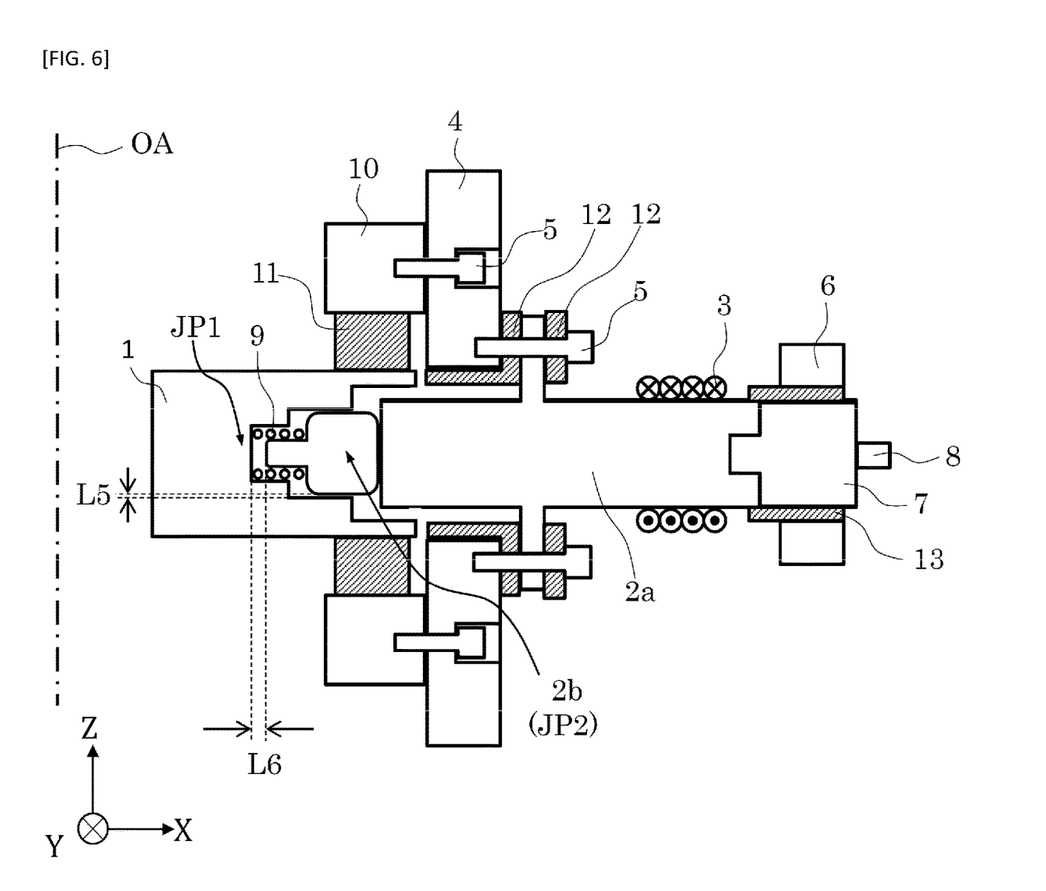
FIG. 6 is a cross-sectional view of a multipole unit according to a third embodiment.

As shown in FIG. 6, the pole 1 in the third embodiment constitutes the electromagnetic field composite type pole as in the second embodiment. However, in the third embodiment, the shaft 2 includes a first shaft member 2a and a second shaft member 2b that is in physical contact with the first shaft member 2a. An entire length of the shaft 2 in a state where the first shaft member 2a and the second shaft member 2b are in contact with each other is equal to a length of the shaft 2 in the first embodiment or the second embodiment.

Similarly to the shaft 2 described in the first embodiment, the first shaft member 2a and the second shaft member 2b are made of, for example, a soft magnetic metal material such as pure iron, permalloy, or permendur. The coil 3 is wound around the first shaft member 2a, and the voltage supply terminal 8 is provided on the first shaft member 2a (coma 7).

The second shaft member 2b is disposed to be closer to the pole 1 than the first shaft member 2a, and constitutes the second fitting portion JP2. The second fitting portion JP2 is loosely inserted into the first fitting portion JP1 of the pole 1. Accordingly, the magnetic flux is transmitted from the first shaft member 2a to the pole 1 via the second shaft member 2b.

The second shaft member 2b receives an elastic force from the elastic member 9 provided in the first fitting portion JP1 and is pushed out toward the first shaft member 2a. Therefore, the first shaft member 2a and the second shaft member 2b are in physical contact with each other.

In the first embodiment and the second embodiment, since the shaft 2 is long, the gap (distances L1 and L3) between the first fitting portion JP1 and the second fitting portion JP2 needs to be at least several hundreds of micrometers to absorb the assembling tolerance.

In contrast, in the third embodiment, for absorption of the assembling tolerance of the first shaft member 2a, a gap between the first fitting portion JP1 of the pole 1 and the first shaft member 2a is secured to several hundreds of micrometers. Meanwhile, a length of the second shaft member 2b is less than the length of the shaft 2 in the first embodiment and the second embodiment, and is less than a length of the first shaft member 2a in the third embodiment.

Therefore, by directly loosely inserting the second shaft member 2b that is the second fitting portion JP2 to the first fitting portion JP1, the distance L5 between the first fitting portion JP1 and the second fitting portion JP2 the second fitting portion JP2 can be set to several tens of micrometers or less. That is, a shortest distance among the distances between the first fitting portion JP1 and the shaft 2 is the distance L5 between the first fitting portion JP1 and the second shaft member 2b in the direction perpendicular to the direction (X direction) in which the second fitting portion JP2 is fitted to the first fitting portion JP1. The distance L6 is several millimeters.

In the third embodiment, since the distance L5 is less than the distance L1 in the first embodiment and the distance L3 in the second embodiment, the transmission rate of the magnetic flux can be improved. Since the gap is small, variation in the transmission rate of the magnetic flux to each pole 1 is reduced, and the uniformity of the magnetic field generated at a tip end portion of the pole 1 can be improved.

A method of assembling the multipole unit 109a according to the third embodiment will be described below.

First, the pole 1, the insulating members 11, and the fixing metal fittings 10 are assembled by, for example, brazing. Next, the fixing metal fittings 10 and the housing 4 are fixed by the screws 5. Next, the elastic member 9 is provided in the first fitting portion JP1 of the pole 1. Next, the second shaft member 2b (second fitting portion JP2) is loosely inserted into the first fitting portion JP1, and the second fitting portion JP2 is brought into contact with the elastic member 9. Next, the first shaft member 2a is pressed against the second shaft member 2b. The second shaft member 2b is pushed out toward the first shaft member 2a by the elastic force from the elastic member 9, and is brought into contact with the first shaft member 2a.

Next, the first shaft member 2a is fixed to the housing 4 via the insulating members 12 by the screws 5, and is fixed to the outer magnetic path 6 via the insulating sleeve 13 by the coma 7. In a state where the first shaft member 2a is in contact with the second shaft member 2b, a position of the first shaft member 2a is fixed, thereby also fixing a position of the second shaft member 2b.

Fourth Embodiment

The multipole unit 109a according to a fourth embodiment will be described below with reference to FIG. 7. In the following description, differences from the third embodiment will be mainly described, and description of points that overlap with the third embodiment will be omitted.

Figure 7:
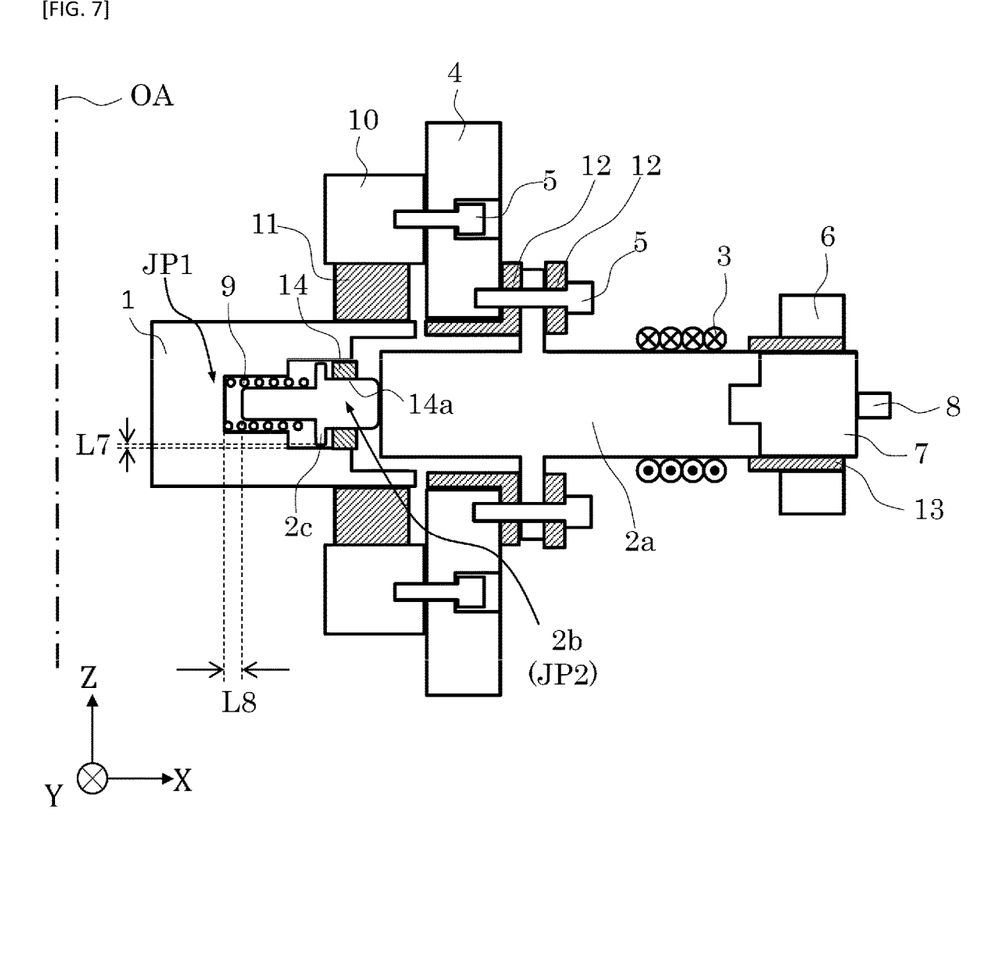
FIG. 7 is a cross-sectional view of a multipole unit according to a fourth embodiment.

As shown in FIG. 7, in the fourth embodiment, the second shaft member 2b is not shaped like a simple cylinder or a rectangular parallelepiped, but includes a protruding portion 2c protruding at a middle portion. The multipole unit 109a further includes a protection member 14. The protection member 14 is fixed to the first fitting portion JP1 of the pole 1 and has a through hole 14a through which the second shaft member 2b can pass.

The protection member 14 is a ring-shaped member and is provided to prevent the second shaft member 2b from falling off from the first fitting portion JP1. As a method of fixing the protection member 14 to the first fitting portion JP1 of the pole 1, for example, a method of cutting a screw thread on a side surface portion of the protection member 14 and fixing the screw thread to a screw hole provided in the pole 1, or a method of press-fitting the side surface portion of the protection member 14 into the first fitting portion JP1 can be mentioned.

The protruding portion 2c has a width greater than a width of the second shaft member 2b around the protruding portion 2c and a diameter of the through hole 14a in the Z direction. The protruding portion 2c is positioned to be farther from the first shaft member 2a than the protection member 14. A part of the second shaft member 2b passes through the through hole 14a, but the protruding portion 2c does not pass through the through hole 14a and is in contact with the protection member 14.

Also in the fourth embodiment, as in the third embodiment, the first shaft member 2a and the second shaft member 2b are in physical contact with each other, so that the magnetic flux is transmitted. Here, a portion of the second shaft member 2b that is closer to the first shaft member 2a than the protruding portion 2c passes through the through hole 14a and is in physical contact with the first shaft member 2a.

Also in the fourth embodiment, as in the third embodiment, the gap between the first fitting portion JP1 of the pole 1 and the first shaft member 2a can be set to several hundreds of micrometers. The distance L7 can be set to several tens of micrometers or less, and the distance L8 can be set to several millimeters. That is, also in the fourth embodiment, the shortest distance among the distances between the first fitting portion JP1 and the shaft 2 is the distance L7 between the first fitting portion JP1 and the second shaft member 2b in the direction perpendicular to the direction (X direction) in which the second fitting portion JP2 is fitted to the first fitting portion JP1.

Therefore, also in the fourth embodiment, since the distance L7 is short, the transmission rate of the magnetic flux can be improved. Since the gap is small, the variation in the transmission rate of the magnetic flux to each pole 1 is reduced, and the uniformity of the magnetic field generated at the tip end portion of the pole 1 can be improved.

A method of assembling the multipole unit 109a according to the fourth embodiment will be described below.

First, the pole 1, the insulating members 11, and the fixing metal fittings 10 are assembled by, for example, brazing. Next, the elastic member 9 is provided in the first fitting portion JP1 of the pole 1. Next, the second shaft member 2b (second fitting portion JP2) is loosely inserted into the first fitting portion JP1, and the second fitting portion JP2 is brought into contact with the elastic member 9.

Next, the protection member 14 is fixed to the first fitting portion JP1 of the pole 1 such that a part of the second shaft member 2b passes through the through hole 14a. Here, the second shaft member 2b is pushed out in a direction away from the pole 1 by the elastic force from the elastic member 9, but the protruding portion 2c does not pass through the protection member 14, and thus the position of the second shaft member 2b is fixed in a state where the protruding portion 2c is in contact with the protection member 14. Next, the fixing metal fittings 10 and the housing 4 are fixed by the screws 5.

As described above, in the fourth embodiment, with the protection member 14, it is possible to prevent the second shaft member 2b from falling off from the first fitting portion JP1. Therefore, before the pole 1 is fixed to the housing 4, the elastic member 9, the second shaft member 2b, and the protection member 14 can be put into the first fitting portion JP1 and positions thereof can be fixed. Therefore, no operation in which a stress is applied to the pole 1 is performed after the pole 1 is fixed to the housing 4, and thus the positional deviation and the deformation of the pole 1 can be more efficiently prevented, and the ease of assembling can be achieved.

Thereafter, the first shaft member 2a is pressed against the second shaft member 2b. The second shaft member 2b is pushed toward the pole 1 side while being in contact with the first shaft member 2a. Therefore, the protruding portion 2c enters a state of being separated from the protection member 14. Next, the first shaft member 2a is fixed to the housing 4 via the insulating members 12 by the screws 5, and is fixed to the outer magnetic path 6 via the insulating sleeve 13 by the coma 7. In the state where the first shaft member 2a is in contact with the second shaft member 2b, the position of the first shaft member 2a is fixed, thereby also fixing the position of the second shaft member 2b.

Here, it has been described that the protruding portion 2c enters a state of being separated from the protection member 14 after the first shaft member 2a is pressed against the second shaft member 2b, but it is not essential that the protruding portion 2c is separated from the protection member 14 for a final structure. The first shaft member 2a may not be pressed against the second shaft member 2b more than necessary, and the protruding portion 2c may be in physical contact with the protection member 14 for the final structure, as long as the position of the second shaft member 2b is appropriate and the first shaft member 2a and the second shaft member 2b are in physical contact with each other.

Fifth Embodiment

The multipole unit 109a according to a fifth embodiment will be described below with reference to FIGS. 8 and 9. In the following description, differences from the fourth embodiment will be mainly described, and description of points that overlap with the fourth embodiment will be omitted.

Figure 8:
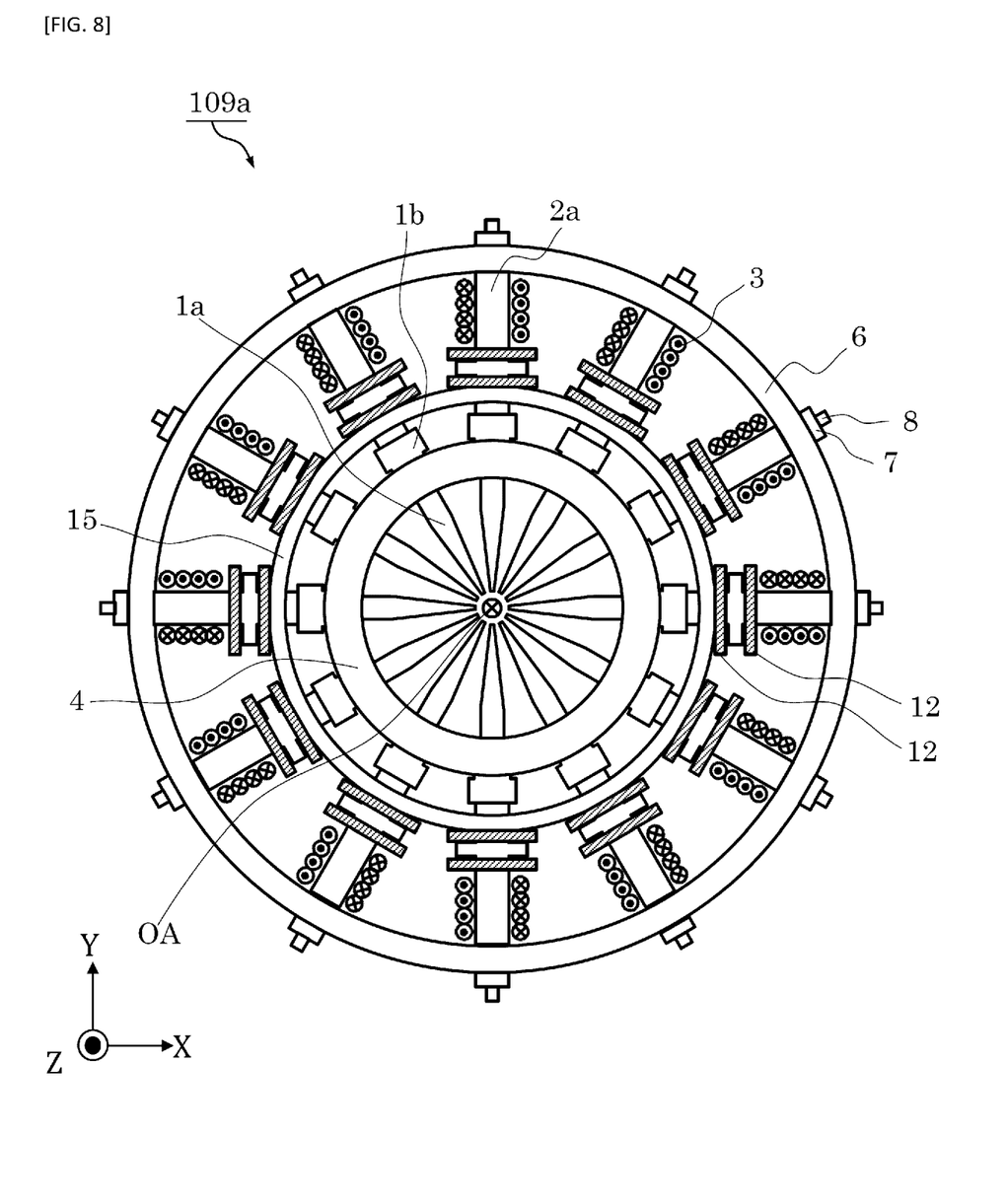
FIG. 8 is a plan view of a multipole unit according to a fifth embodiment.
Figure 9:
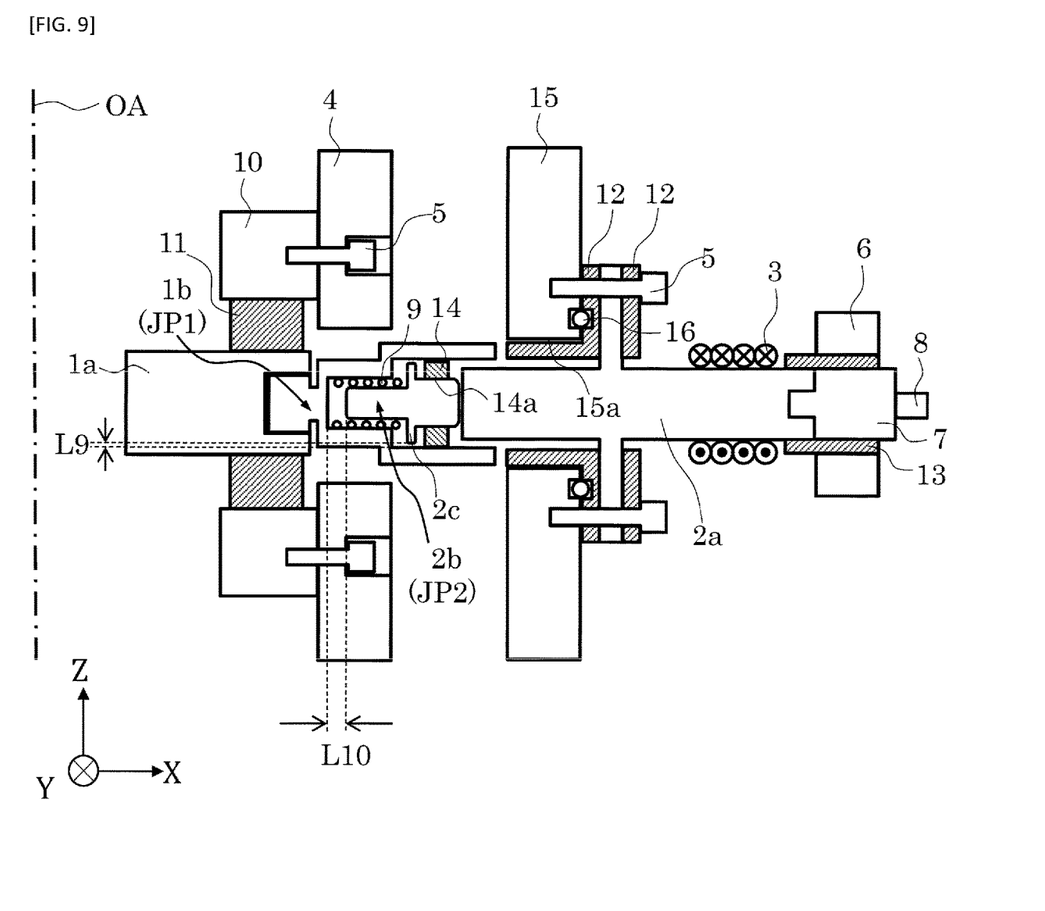
FIG. 9 is a cross-sectional view of the multipole unit according to the fifth embodiment.

As shown in FIGS. 8 and 9, in the fifth embodiment, the pole 1 includes a first pole member 1a and a second pole member 1b that is in physical contact with the first pole member 1a. The second pole member 1b is disposed to be closer to the second shaft member 2b than the first pole member 1a, and constitutes the first fitting portion JP1. A screw thread is cut in the second pole member 1b, and the screw thread is fixed to a screw hole provided in the first pole member 1a, so that the first pole member 1a and the second pole member 1b are coupled and are in physical contact with each other.

Similarly to the pole 1 described in the first embodiment, the first pole member 1a and the second pole member 1b are made of, for example, a soft magnetic metal material such as pure iron, permalloy, or permendur.

The first pole member 1a is fixed to the housing 4 via the insulating members 11 and the fixing metal fittings 10, so that the first pole member 1a is electrically insulated from the housing 4. The first pole member 1a, the insulating members 11, and the fixing metal fittings 10 are assembled by brazing or the like. The protection member 14 is fixed to the second pole member 1b.

Also in the fifth embodiment, as in the fourth embodiment, the gap between the first fitting portion JP1 of the pole 1 and the first shaft member 2a can be set to several hundreds of micrometers. The distance L9 can be set to several tens of micrometers or less, and the distance L10 can be set to several millimeters. That is, also in the fifth embodiment, the shortest distance among the distances between the first fitting portion JP1 and the shaft 2 is the distance L9 between the first fitting portion JP1 and the second shaft member 2b in the direction perpendicular to the direction (X direction) in which the second fitting portion JP2 is fitted to the first fitting portion JP1.

Therefore, also in the fifth embodiment, since the distance L9 is short, the transmission rate of the magnetic flux can be improved. Since the gap is small, the variation in the transmission rate of the magnetic flux to each pole 1 is reduced, and the uniformity of the magnetic field generated at the tip end portion of the pole 1 can be improved.

In the fifth embodiment, the multipole unit 109a further includes a partition wall 15. The partition wall 15 is made of a non-magnetic metal and has a through hole 15a through which the first shaft member 2a can pass. In the fifth embodiment, since the pole 1 constitutes the electromagnetic field composite type pole, the pole 1 and the shaft 2 need to be electrically insulated not only from the housing 4 and the outer magnetic path 6 but also from the partition wall 15.

Therefore, the first shaft member 2a is fixed to the partition wall 15 via the insulating members 12 so as to be electrically insulated from the partition wall 15, and is fixed to the outer magnetic path via the insulating sleeve 13 so as to be electrically insulated from the outer magnetic path 6. The second shaft member 2b is in physical contact with a portion of the first shaft member 2a that passes through the through hole 15a.

An inside of the partition wall 15 can be sealed to form a vacuum state by putting a sealing member 16 into fastening portions between the partition wall 15, and the insulating member 12 and the first shaft member 2a. For example, an O-ring can be applied as the sealing member 16, but the sealing member 16 is not limited to the O-ring, and may be another configuration.

The first pole member 1a, the second pole member 1b, and the second shaft member 2b are isolated from the coil 3 and the outer magnetic path 6 by the partition wall 15. Therefore, a pressure in a space in which the first pole member 1a, the second pole member 1b, and the second shaft member 2b are provided can be changed to be different from a pressure in a space in which the coil 3 and the outer magnetic path 6 are provided. For example, the former space may be set in a vacuum state, and the latter space may be set in the atmosphere.

For example, by arranging the coil 3 in the atmosphere, it is possible to prevent a decrease in a degree of vacuum due to a gas released from the coil 3 and to prevent contamination of a sample and a component in the vacuum. By arranging the coil 3 in the atmosphere, Joule heat can be transferred to the atmosphere when a current flows through the coil 3, and temperature rise can be mitigated.

An isolation structure using the partition wall 15 is not limited to the fifth embodiment, and can also be applied to the first to fourth embodiments. In this case, by providing the partition wall 15 separately from the housing 4 and forming the isolation structure, the pole 1 can be arranged in the vacuum, and a part of the shaft 2, the exciting coil 3, and the outer magnetic path 6 can be arranged in the atmosphere.

A method of assembling the multipole unit 109a according to the fifth embodiment will be described below.

First, the first pole member 1a, the insulating members 11, and the fixing metal fittings 10 are assembled by, for example, brazing. Next, the elastic member 9 is disposed in the second pole member 1b (first fitting portion JP1). Next, the second shaft member 2b (second fitting portion JP2) is loosely inserted into the first fitting portion JP1, and the second fitting portion JP2 is brought into contact with the elastic member 9.

Next, the protection member 14 is fixed to the first fitting portion JP1 such that a part of the second shaft member 2b passes through the through hole 14a. Here, the second shaft member 2b is pushed out in a direction away from the pole 1 by the elastic force from the elastic member 9, but the protruding portion 2c does not pass through the protection member 14, and thus the position of the second shaft member 2b is fixed in a state where the protruding portion 2c is in contact with the protection member 14.

Next, the first pole member 1a and the second pole member 1b are coupled. Next, by fixing the fixing metal fittings 10 and the housing 4 by the screws 5, the first pole member 1a and second pole member 1b that are coupled are fixed to the housing 4.

First, the first pole member 1a may be fixed to the housing 4, and then the second pole member 1b may be coupled to the first pole member 1a. As described above, in the fifth embodiment, as in the fourth embodiment, the positional deviation and the deformation of the pole 1 can be more efficiently prevented, and the ease of assembling can be achieved. Furthermore, in the fifth embodiment, a degree of freedom of assembling is higher than that of the fourth embodiment.

Thereafter, the first shaft member 2a is pressed against the second shaft member 2b. The second shaft member 2b is pushed toward the pole 1 side while being in contact with the first shaft member 2a. Therefore, the protruding portion 2c enters a state of being separated from the protection member 14. Next, the first shaft member 2a is fixed to the partition wall 15 via the insulating members 12 by the screws 5, and is fixed to the outer magnetic path 6 via the insulating sleeve 13 by the coma 7. In the state where the first shaft member 2a is in contact with the second shaft member 2b, the position of the first shaft member 2a is fixed, thereby also fixing the position of the second shaft member 2b.

As in the fourth embodiment, the protruding portion 2c may be in physical contact with the protection member 14 for the final structure.

Sixth Embodiment

The charged particle beam device 100 according to a sixth embodiment will be described below with reference to FIG. 10. The charged particle beam device 100 is, for example, a scanning electron microscope (SEM), and includes the multipole unit 109a described in the first to fifth embodiments. The charged particle beam device 100 further includes a charged particle gun 200 that emits a charged particle beam 104, a charged particle beam irradiation system 300 that converges the charged particle beam 104, and control units 150 to 162 that control operations of the respective configurations. In addition, the charged particle beam device 100 includes, internally or externally, an image display unit 163 that is electrically connected to the overall control unit 162.

The multipole unit 109a is provided in the charged particle beam irradiation system 300, is arranged in multiple stages in a direction along the optic axis OA of the charged particle beam 104, and constitutes the aberration corrector 109 that corrects an aberration generated in the charged particle beam irradiation system 300.

As illustrated in FIG. 10, the control units 150 to 161 are electrically connected to configurations such as a charged particle source 101, and control operations of the configurations. The overall control unit 162 is electrically connected to each of the control units 150 to 161, and controls these units. Therefore, in the present application, each of the control units 150 to 161 may be regarded as a part of the overall control unit 162, and the overall control unit 162 may be simply referred to as a "control unit".

The charged particle gun 200 includes the charged particle source 101 that generates the charged particle beam 104, a first anode 102, and a second anode 103. Charged particles (electrons) are emitted from the charged particle source 101 when a voltage is applied between the charged particle source 101 and the first anode 102 under control of the charged particle gun control unit 150. Next, when a voltage is applied between the first anode 102 and the second anode 103 under the control of the charged particle gun control unit 150, the emitted charged particles are accelerated and focused, and become the charged particle beam (primary electron beam) 104. In this way, the charged particle beam 104 is emitted from the charged particle gun 200 to the charged particle beam irradiation system 300.

The charged particle beam 104 is focused by a first condenser lens 105, and an opening of an object aperture 106 restricts an amount of charged particles passing therethrough. The charged particle beam 104 passing through the object aperture 106 is incident on a second condenser lens 107, is adjusted to a trajectory parallel to the optic axis OA, passes through a two-stage deflector 108, and is incident on the aberration corrector 109. In the two-stage deflector 108, the charged particle beam 104 is shifted toward a central axis of the aberration corrector 109. The charged particle beam 104 that is incident on the aberration corrector 109 is emitted from the aberration corrector 109 after an angle of the trajectory of the charged particles is adjusted to offset the aberration generated in the charged particle beam irradiation system 300.

The charged particle beam 104 emitted from the aberration corrector 109 is shifted toward a central axis of a third condenser lens 111 by a two-stage deflector 110, and is incident on the third condenser lens 111. The trajectory of the charged particle beam 104 that is incident on the third condenser lens 111 is corrected by a stigmator 112. The charged particle beam 104 passes through an opening of a secondary electron conversion plate 113, and is focused on the optic axis OA. Thereafter, the charged particle beam 104 passes through an ExB deflector 114, an image shift deflector 116, and a scanning deflector 117, and is incident on an object lens 118. The incident charged particle beam 104 is focused on a sample 120 by the object lens 118, and a minute spot is formed. The sample 120 is placed on a stage 119. A retarding power supply 121 is electrically connected to the stage 119.

The sample 120 is scanned with the charged particle beam 104 focused on the sample 120 by the scanning deflector 117. At this time, signal electrons 122 such as secondary electrons and backscattered electrons are generated by interaction between the charged particle beam 104 and a fine pattern formed on the sample 120. The generated signal electrons 122 pass through the object lens 118 and collide with the secondary electron conversion plate 113 to generate tertiary electrons 123. The signal electrons 122 and the tertiary electrons 123 are deflected by the ExB deflector 114 and detected by a detector 115.

The detected electrons are converted into an electric signal synchronized with the scanning. The electronic signal is taken into the overall control unit 162. Image processing is performed by the overall control unit 162, and an SEM image is displayed on the image display unit 163. When a field of view of the displayed image is to be moved, the stage 119 is moved, or an irradiation position of the charged particle beam 104 on the sample 120 is moved by the image shift deflector 116.

For example, in a multipole unit in the related art, when positional deviation and deformation of the pole 1 occurs, a problem arises that an unexpected parasitic field is generated and parasitic aberration is caused. In that case, when the multipole unit is applied in a charged particle beam device, a problem arises that resolution of an observation image deteriorates.

In contrast, the deterioration of the resolution of the observation image can be prevented by using the multipole unit 109a according to the first to fifth embodiments in the charged particle beam device 100 according to the sixth embodiment.

Although the scanning electron microscope (SEM) is exemplified as the charged particle beam device 100 in the sixth embodiment, the charged particle beam device 100 can be applied to other devices. For example, the charged particle beam device 100 may be a transmission electron microscope (TEM), a scanning transmission electron microscope (STEM), a scanning ion microscope (SIM), or a focused ion beam (FIB) device. When the charged particle beam device 100 is the scanning ion microscope (SIM) or the focused ion beam (FIB) device, ions are generated from the charged particle source 101, and the charged particle beam 104 is an ion beam.

Although the invention has been specifically described with reference to the above-described embodiments, the invention is not limited to the above-described embodiments, and various modifications can be made without departing from the gist of the invention.

REFERENCE SIGN LIST

JP1 first fitting portion (recessed portion, protruding portion)
JP2 second fitting portion (protruding portion, recessed portion)
OA optic axis
1 pole
1a first pole member
1b second pole member (cap)
2 shaft
2a first shaft member
2b second shaft member
2c protruding portion
3 coil
4 housing
5 screw
6 outer magnetic path (magnetic yoke)
7 coma
8 voltage supply terminal
9 elastic member
10 fixing metal fitting
11 insulating member
12 insulating member
13 insulating sleeve
14 protection member
14a through hole
15 partition wall
15a through hole
16 sealing member
100 charged particle beam device
101 charged particle source
102 first anode
103 second anode
104 charged particle beam
105 first condenser lens
106 object aperture
107 second condenser lens
108 two-stage deflector
109 aberration corrector
109a multipole unit
110 two-stage deflector
111 third condenser lens
112 stigmator
113 secondary electron conversion plate
114 ExB deflector
115 detector
116 image shift deflector
117 scanning deflector
118 object lens
119 stage
120 sample
121 retarding power supply
122 signal electron
123 tertiary electron
150 charged particle gun control unit
151 first condenser lens control unit
152 second condenser lens control unit
153 deflector control unit
154 corrector control unit
155 deflector control unit
156 third condenser lens control unit
157 stigmator control unit
158 detector control unit
159 ExB control unit
160 deflector control unit
161 object lens control unit
162 overall control unit
163 image display unit
200 charged particle gun
300 charged particle beam irradiation system

The invention claimed is:

1. A multipole unit, comprising:
a pole made of a soft magnetic metal material;
a shaft made of a soft magnetic metal material and magnetically connected to the pole; and
a coil wound around the shaft, wherein
the pole is provided with a first fitting portion that forms a first recessed portion or a first protruding portion,
the shaft is provided with a second fitting portion that forms a second protruding portion or a second recessed portion,
the second fitting portion forms the second protruding portion when the first fitting portion is the first recessed portion, and forms the second recessed portion when the first fitting portion is the first protruding portion, and
the first fitting portion and the second fitting portion are fitted with each other such that the pole and the shaft are physically separated from each other.

2. The multipole unit according to claim 1, wherein
the shaft is provided with a voltage supply terminal configured to supply a predetermined voltage to the shaft, and
an elastic member having conductivity is provided in a gap between the first fitting portion and the second fitting portion so that the pole and the shaft are electrically connected.

3. The multipole unit according to claim 2, wherein
the elastic member is made of a soft magnetic metal material, and is capable of transmitting a magnetic flux from the shaft to the pole.

4. The multipole unit according to claim 2, further comprising:
a plurality of the poles;
a plurality of the shafts;
a plurality of the coils;
a housing made of a non-magnetic metal; and an outer magnetic path made of a soft magnetic metal material and magnetically connected to the plurality of shafts, wherein each of the plurality of poles is fixed to the housing via a first insulating member so as to be electrically insulated from the housing, each of the plurality of the shafts is fixed to the housing via a second insulating member so as to be electrically insulated from the housing, and is fixed to the outer magnetic path via an insulating sleeve so as to be electrically insulated from the outer magnetic path, and voltages different from one another are able to be independently applied to the plurality of poles from the voltage supply terminal electrically connected to each of the plurality of poles.

5. The multipole unit according to claim 2, wherein the shaft comprises a first shaft member and a second shaft member in physical contact with the first shaft member, the first shaft member and the second shaft member are both made of a soft magnetic metal material, the coil is wound around the first shaft member, the voltage supply terminal is provided on the first shaft member, and the second shaft member is disposed to be closer to the pole than the first shaft member, and constitutes the second fitting portion.

6. The multipole unit according to claim 5, wherein a shortest distance among distances between the first fitting portion and the shaft is a distance between the first fitting portion and the second shaft member in a direction perpendicular to a direction in which the second fitting portion is fitted to the first fitting portion.

7. The multipole unit according to claim 5, further comprising:

a protection member fixed to the first fitting portion of the pole and provided with a first through hole through which the second shaft member is able to pass, wherein the second shaft member comprises a protruding portion having a width greater than a width of the second shaft member around the protruding portion and a diameter of the first through hole in a direction perpendicular to a direction in which the second fitting portion is fitted in the first fitting portion, wherein the protruding portion is positioned to be farther from the first shaft member than the protection member, and a portion of the second shaft member that is closer to the first shaft member than the protruding portion passes through the first through hole and is in physical contact with the first shaft member.

8. The multipole unit according to claim 7, wherein the pole comprises a first pole member and a second pole member in physical contact with the first pole member, the first pole member and the second pole member are both made of a soft magnetic metal material, the protection member is fixed to the second pole member, and the second pole member is disposed to be closer to the second shaft member than the first pole member, and constitutes the first fitting portion.

9. The multipole unit according to claim 8, further comprising:

a housing made of a non-magnetic metal;

an outer magnetic path made of a soft magnetic metal material and magnetically connected to the shaft; and a partition wall made of a non-magnetic metal and provided with a second through hole through which the first shaft member is able to pass, wherein the first pole member is fixed to the housing via a first insulating member so as to be electrically insulated from the housing, the first shaft member is fixed to the partition wall via a second insulating member so as to be electrically insulated from the partition wall, and is fixed to the outer magnetic path via an insulating sleeve so as to be electrically insulated from the outer magnetic path, the second shaft member is in physical contact with a portion of the first shaft member that passes through the second through hole, the first pole member, the second pole member, and the second shaft member are isolated from the coil and the outer magnetic path by the partition wall, and a pressure in a space in which the first pole member, the second pole member, and the second shaft member are provided is variable to be different from a pressure in a space in which the coil and the outer magnetic path are provided.

10. A charged particle beam device including the multipole unit according to claim 1, comprising:

a charged particle gun configured to emit a charged particle beam; and a charged particle beam irradiation system configured to converge the charged particle beam emitted from the charged particle gun, wherein the multipole unit is in the charged particle beam irradiation system.

11. The charged particle beam device according to claim 10, wherein the multipole unit comprises a plurality of the poles, a plurality of the shafts, and a plurality of the coils, is arranged in multiple stages in a direction along an optic axis of the charged particle beam, and constitutes an aberration corrector configured to correct an aberration generated in the charged particle beam irradiation system.

* * * * *